United States Patent
Nakiboglu et al.

(10) Patent No.: US 9,939,740 B2
(45) Date of Patent: Apr. 10, 2018

(54) LITHOGRAPHIC APPARATUS AND DEVICE MANUFACTURING METHOD

(71) Applicant: ASML Netherlands B.V., Veldhoven (NL)

(72) Inventors: Günes Nakiboglu, Eindhoven (NL); Martijn Van Baren, Joure (NL); Frank Johannes Jacobus Van Boxtel, Eindhoven (NL); Koen Cuypers, Lommel (BE); Jeroen Gerard Gosen, Geldrop (NL); Laurentius Johannes Adrianus Van Bokhoven, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/116,794

(22) PCT Filed: Jan. 20, 2015

(86) PCT No.: PCT/EP2015/050936
§ 371 (c)(1),
(2) Date: Aug. 4, 2016

(87) PCT Pub. No.: WO2015/124344
PCT Pub. Date: Aug. 27, 2015

(65) Prior Publication Data
US 2016/0349631 A1    Dec. 1, 2016

(30) Foreign Application Priority Data

Feb. 20, 2014  (WO) .................. PCT/EP2014/053372
May 1, 2014    (EP) ..................................... 14166771
Oct. 10, 2014  (EP) ..................................... 14188390

(51) Int. Cl.
*B60R 1/06* (2006.01)
*G03B 27/52* (2006.01)
(Continued)

(52) U.S. Cl.
CPC ...... *G03F 7/70858* (2013.01); *G03F 7/70358* (2013.01); *G03F 7/70716* (2013.01); *G03F 7/70908* (2013.01)

(58) Field of Classification Search
CPC ............. G03F 7/70358; G03F 7/70716; G03F 7/70858; G03F 7/70908
(Continued)

(56) References Cited

U.S. PATENT DOCUMENTS 7,253,875 B1 *   8/2007   Luttikhuis ........... G03F 7/70775
                                                              355/30
7,397,056 B2    7/2008   Sjmaenok et al.
(Continued)

FOREIGN PATENT DOCUMENTS

CN   1892441      1/2007
CN   101034261    9/2007
(Continued)

OTHER PUBLICATIONS

International Search Report and Written Opinion dated Mar. 23, 2015 in corresponding International Patent Application No. PCT/EP2015/050936.
(Continued)

*Primary Examiner* — Colin Kreutzer
(74) *Attorney, Agent, or Firm* — Pillsbury Winthrop Shaw Pittman, LLP

(57) ABSTRACT

A lithographic apparatus including a barrier system and a device manufacturing method using such a lithographic apparatus. The barrier system is used to maintain a protected volume of gas within a barrier. The protected volume may be
(Continued)

maintained when different components of the lithographic apparatus move relative to each other. The barrier system may be used in different locations within the lithographic apparatus. The geometry of the barrier affects how efficiently the protected volume is maintained, especially at high speeds. The geometry reduces the amount of ambient gas entering the protected volume from outside the barrier.

21 Claims, 7 Drawing Sheets

(51) Int. Cl.
  *G03B 27/58* (2006.01)
  *G03B 27/62* (2006.01)
  *H02K 41/02* (2006.01)
  *G03F 7/20* (2006.01)

(58) Field of Classification Search
  USPC ............ 310/12.06; 355/30, 72, 75; 359/509
  See application file for complete search history.

(56) References Cited

U.S. PATENT DOCUMENTS

| | | | |
|---|---|---|---|
| 2003/0071982 A1* | 4/2003 | Miyajima | G03F 7/70691 355/72 |
| 2006/0152696 A1* | 7/2006 | Boogaard | G03B 27/42 355/53 |
| 2008/0043212 A1 | 2/2008 | Shibazaki | |
| 2008/0212046 A1 | 9/2008 | Riepen et al. | |
| 2009/0237634 A1* | 9/2009 | Eussen | G01D 5/24461 355/67 |
| 2010/0313974 A1 | 12/2010 | Riepen et al. | |
| 2011/0199601 A1* | 8/2011 | Kaneko | G03F 7/70341 355/72 |
| 2012/0052447 A1* | 3/2012 | Westerlaken | G03F 7/70341 430/322 |
| 2013/0070220 A1 | 3/2013 | Bessems et al. | |
| 2015/0131067 A1 | 5/2015 | Baselmans et al. | |

FOREIGN PATENT DOCUMENTS

| | | | |
|---|---|---|---|
| JP | 2001-358056 A | 12/2001 | |
| JP | 2004214552 A * | 7/2004 | ........... G03F 7/7085 |
| JP | 2005-57075 | 3/2005 | |
| JP | 2007-251156 A | 9/2007 | |
| JP | 2010-278432 | 12/2010 | |
| JP | 2012-049531 A | 3/2012 | |
| JP | 2013-065829 A | 4/2013 | |
| WO | 2013/174646 | 11/2013 | |

OTHER PUBLICATIONS

Office Action issued in corresponding Chinese Patent Application No. 201580009245.3, dated May 2, 2017.
Office Action issued in corresponding Japanese Patent Application No. 2016-546051 dated Aug. 25, 2017.
Office Action issued in corresponding Korean Patent Application No. 10-2016-7025720 dated Jan. 16, 2018 with Egnlish translation.

* cited by examiner

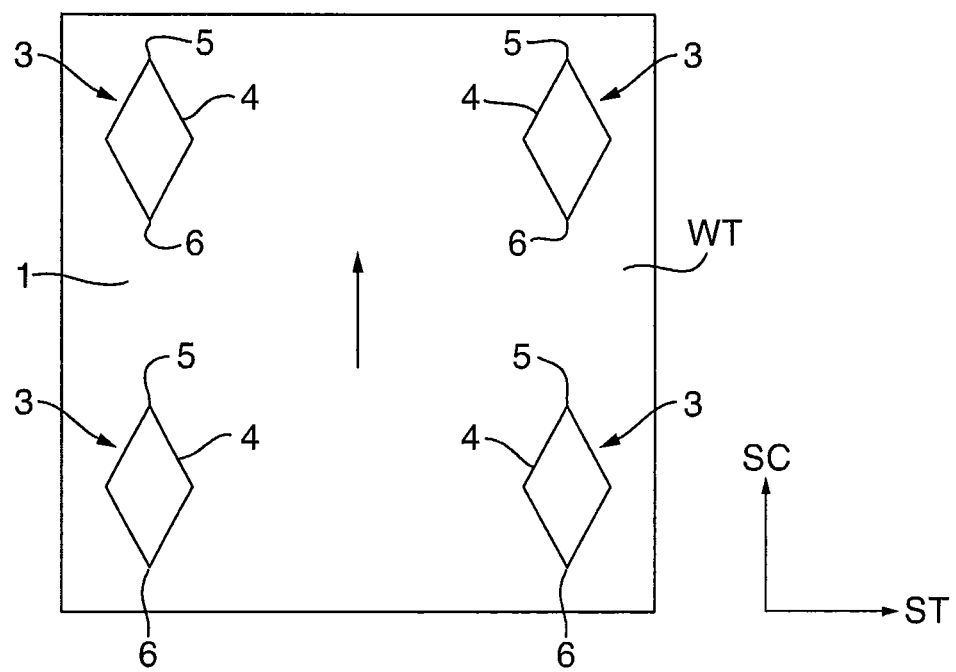

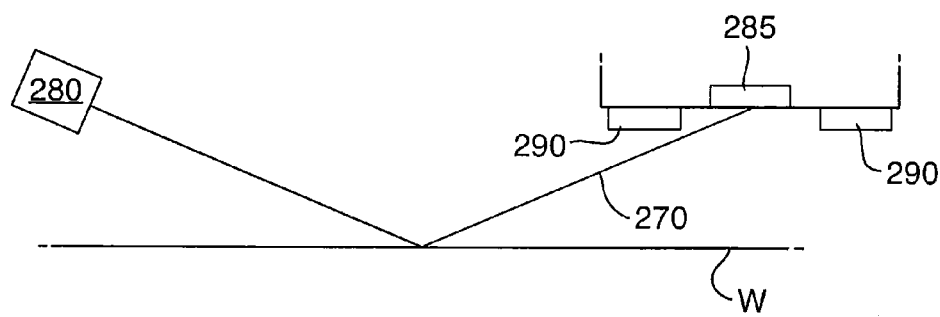
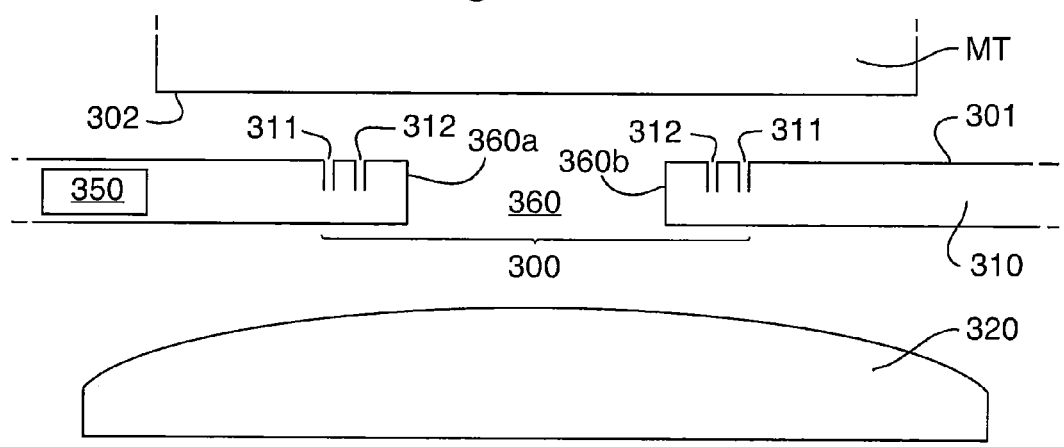

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The rate at which the substrates can be patterned, known as throughput, is a major performance criterion in lithography apparatus systems and it is beneficial to increase this rate. Throughput is dependent on multiple factors, for example the speed at which exposure takes place and the speed at which measurements can be taken. Therefore, it is beneficial to have high scanning speeds for both exposure and measurement. However, it is important to maintain accuracy of measurements and patterning at the high scanning speeds.

Radiation beams in atmospheric systems pass through gas, which occurs for example, in a lithographic apparatus. Local fluctuations in the characteristics of a gas can affect a radiation beam passing through it. In known apparatus, barriers are used to reduce the effects of fluctuations in gases on radiation beams. However, known barriers become less effective at high speeds. Therefore, it is an aim of the present invention to provide an apparatus with an improved barrier system.

SUMMARY OF THE INVENTION

According to an aspect of the invention, there is provided a lithographic apparatus comprising a first component and a second component that are configured to undergo relative movement with respect to one another in one of a scanning direction and a stepping direction substantially perpendicular to the scanning direction, wherein; the first component has a first surface; the second component has a second surface; wherein the first surface and the second surface face each other; at least a specific one of the first surface and the second surface accommodates a barrier system; and the barrier system is configured to provide a barrier operative to reduce or prevent an inflow of ambient gas into a protected volume of gas between the first surface and the second surface; and the barrier system comprises at least one of: a wall enclosing part of the protected volume adjacent the specific one of the first surface and second surface; and at least one opening adapted for a flow of barrier gas therefrom for establishing a gas curtain enclosing part of the protected volume adjacent the specific one of the first surface and second surface; the barrier has a geometry in a plane in which the scanning direction and the stepping direction lie, and the barrier is operative to guide a flow of ambient gas around the protected volume, the flow of ambient gas being induced by the relative movement of the first component and the second component; the geometry has a first corner and a second corner; the first corner serves as a leading edge of the barrier and the second corner serves as a trailing edge of the barrier when the first component and the second component move relative to one another in a specific one of the scanning direction and the stepping direction; and the first corner serves as the trailing edge of the barrier and the second corner serves as the leading edge of the barrier when the first component and the second component move relative to one another in a further direction opposite to the specific direction.

According to an aspect of the invention, there is provided a lithographic apparatus comprising a first component and a second component that are configured to undergo relative movement with respect to one another in one of a scanning direction and a stepping direction substantially perpendicular to the scanning direction, wherein: the first component has a first surface; the second component has a second surface; wherein the first surface and the second surface face each other; at least a specific one of the first surface and the second surface accommodates a barrier system; and the barrier system is configured to provide a barrier operative to reduce or prevent an inflow of ambient gas into a protected volume of gas between the first surface and the second surface; and the barrier system comprises at least one of: a wall enclosing part of the protected volume adjacent the specific one of the first surface and second surface; and at least one opening adapted for a flow of barrier gas therefrom for establishing a gas curtain enclosing the part of the protected volume adjacent the specific one of the first surface and second surface; the barrier having a cornered geometry in plan, the cornered geometry having sides between corners which are all non-perpendicular to a specific one of the scanning direction and the stepping direction.

According to an aspect of the invention, there is provided the device manufacturing method comprising projecting a projection beam onto a substrate positioned on a substrate table and optionally using a beam of radiation to measure a property of the apparatus wherein at least one of the projection beam and the beam of radiation passes through a barrier system configured to provide a barrier, the barrier being operative to reduce or prevent an inflow of ambient gas into a protected volume of gas between a first surface and a second surface of the lithographic apparatus for passage therethrough of at least one of the projection beam and the radiation beam, the lithographic apparatus comprising a first component having a first surface and further comprising a second component having a second surface, the first component and the second component being configured to undergo relative movement with respect to one another in one of a scanning direction and a stepping direction substantially perpendicular to the scanning direction, wherein the barrier has a geometry in a plane in which the scanning direction and the stepping direction lie, and the barrier is operative to guide a flow of the ambient gas around the protected volume, the flow of the ambient gas being induced by the relative movement of the first component and the second component; the geometry has a first corner and a second corner; the first corner serves as a leading edge of the barrier and the second corner serves as a trailing edge of the barrier when the first component and the second component move relative to one another in a specific one of the scanning direction and the stepping direction; and the first corner serves as the trailing edge of the barrier and the second corner serves as the leading edge of the barrier when the first component and the second component move relative to one another in a further direction opposite to the specific direction.

According to an aspect of the invention, there is provided the device manufacturing method comprising projecting a projection beam onto a substrate positioned on a substrate table and optionally using a beam of radiation to measure a property of the apparatus wherein at least one of the projection beam and the beam of radiation passes through a barrier system configured to provide a barrier, the barrier being operative to reduce or prevent an inflow of ambient gas into a protected volume of gas between a first surface and a second surface of the lithographic apparatus for passage therethrough of at least one of the projection beam and the radiation beam, the lithographic apparatus comprising a first component having a first surface and further comprising a second component having a second surface, the first component and the second component being configured to undergo relative movement with respect to one another in one of a scanning direction and a stepping direction substantially perpendicular to the scanning direction, the barrier having a cornered geometry in plan, the cornered geometry having sides between corners which are all non-perpendicular to a specific one of the scanning direction and the stepping direction.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts a schematic plan view of a substrate table of a lithographic apparatus according to an embodiment of the present invention;

FIG. 7 depicts a barrier system according to an embodiment of the present invention wherein the sensor is a level sensor for measuring the topography of a surface of a substrate;

FIGS. 8A, 8B and 8C depict a barrier system according to an embodiment of the present invention, which is located near the patterning device.

DETAILED DESCRIPTION

Figure 1:
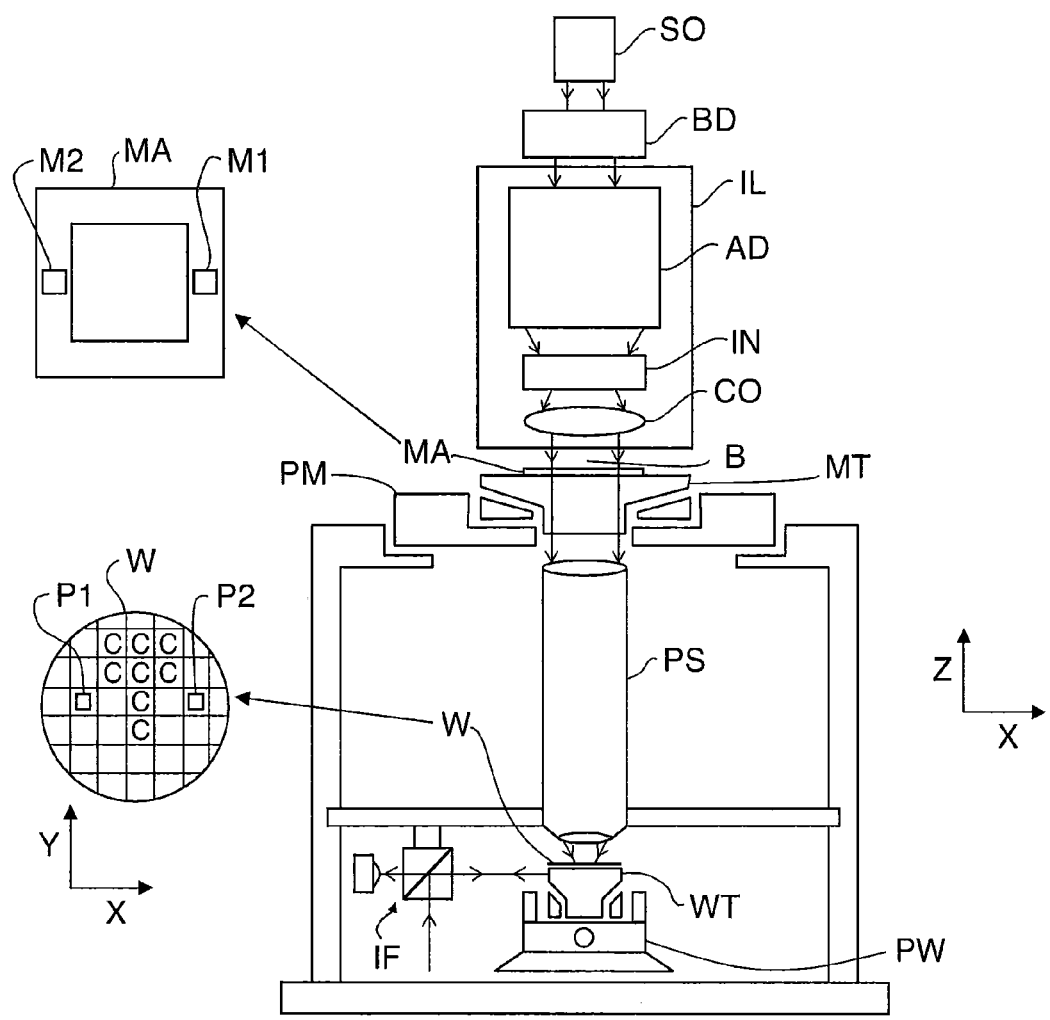
FIG. 1 depicts a lithographic apparatus according to an embodiment of the present invention.

FIG. 1 schematically depicts a lithographic apparatus according to one embodiment of the invention. The apparatus comprises:
an illumination system (illuminator) IL configured to condition a radiation beam B (e.g. UV radiation).
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WT constructed to hold a substrate (e.g. a resist-coated wafer) W and connected to a second positioner PW configured to accurately position the substrate in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation. The illumination system may or may not be considered to form part of the lithographic apparatus.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus can be used in a scanning mode. In the scanning mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. Alternatively, in another scanning mode, the mask table MT is kept essentially stationary holding a programmable patterning device, and the substrate table WT is moved or scanned while a pattern imparted to the radiation beam is projected onto a target portion C.

In the scanning mode, to expose a row or column of target portions the substrate table can move along a meander path or move back and forwards in the scanning direction. Exposure can occur when the substrate table WT is moving forward or backwards along the scanning direction. Both directions of movement are equivalent. Purely for ease of description, one direction is referred to as the forward scanning direction and the other as the backward scanning direction.

The direction in which the substrate table (and/or the mask table MT) is moved in the scanning mode is the scanning direction SC. The substrate table WT (and/or the mask table MT) may be moved in the stepping direction ST during the meander or between rows or columns. The stepping direction ST is substantially perpendicular to the scanning direction SC. The scanning direction SC and the stepping direction ST can be referred to as the X and Y directions respectively, and vice versa.

A lithographic apparatus uses various different radiation beams. These include the projection beam which is a beam of radiation used to irradiate a substrate with a pattern. The radiation beams also include various measurement beams which are used to measure the position, or properties of, different components of the apparatus. Radiation beams are affected by the gases through which the beams pass.

Several factors can affect how a radiation beam propagates through a gas. For example, temperature, humidity and composition may affect the refractive index of a gas. Localised variations of these factors and turbulence can result in non-uniformities and temporal variations in the refractive index of the gas. A radiation beam passing through a gas is affected by non-uniformities and temporal variations in the refractive index. For example, a change in the refractive index can alter the trajectory of the projection beam and/or introduce wavefront errors (i.e. an irregularity in the wavefront in the projection beam). Measurement errors can be induced by variations in the refractive index along a path of a measurement beam. For example, measurement errors can lead to inaccuracies in the positioning of components of the apparatus. Any such inaccuracies can alter the placement of the patterned beam on the substrate and may have a detrimental effect on overlay.

Known systems are in place to try to reduce the fluctuations in the refractive index of an ambient gas through which a radiation beam B passes. For example, a known system includes a gas curtain which is provided by ejecting barrier gas from openings in a surface. The gas curtain forms a barrier which impedes the flow of surrounding ambient gas outside the gas curtain. A gas curtain may be provided around a volume such that the gas within the volume is effectively separated from the ambient gas outside the gas curtain. The gas within the volume may be conditioned such that it is more uniform than the gas outside the volume. Therefore, the gas curtain may be used to provide a barrier around a volume through which a radiation beam passes so as to protect the radiation beam from the effects of changes in ambient gas outside the volume. This volume is referred to as the protected volume. The gas within the volume is referred to as the protected gas. However, any unconditioned ambient gas which enters into the protected volume can affect the propagation of the radiation beam and induce errors.

Although known systems use gas curtains as barriers to reduce the variation in the refractive index, various tests and simulations, such as wind tunnel tests, have shown that as the scanning speed increases, more and more unconditioned ambient gas enters into the protected volume and contaminates the conditioned protected gas.

The gas curtain can be considered as a deformable-body in the flow when a component comprising the barrier is moving or there is relative movement of the flow around the barrier. Regions of stagnant gas develop at the edges of the barrier as a result of relative movement of different components. At these stagnation regions, stagnant gas accumulates leading to a pressure rise which imposes a force on the barrier pushing inwards. The force due to the stagnation region increases with increased velocity. The pressure increases at the barrier and a pressure gradient develops that forces the ambient gas outside the gas barrier into the protected volume. Gas entering into the protected volume in this way can be referred to as break-through. Therefore, at high speeds, known barriers do not provide a significant advantage over previous systems without such barriers.

At high scanning speeds, the break-through of unconditioned ambient gas can be significant. This problem is more prominent in the scanning direction than the stepping direction because the speed of the relative movement in the scanning direction tends to be greater than the speed in the stepping direction. For example, the speed of movement in the scanning direction SC during measurement is approximately 2 m/s and the speed of movement in the stepping direction ST is approximately 0.8 m/s.

The present invention aims to minimize break-through by preventing or decreasing the development of pockets of stagnant gas at the edge of the barrier without reducing the speed of movement of components of the apparatus. This is done by reducing the amount of ambient gas at the leading edge of the barrier as quickly as possible. The present invention identifies that having an interface of the barrier perpendicular to the flow direction increases the size of the stagnation regions.

In the present invention a barrier is configured in such a way as to reduce the stagnation region and protect the protected volume within the barrier. The stagnation region is reduced by streamlining the body such that it has less drag compared to a body with the same (or a similar) cross-sectional area in the flow direction. The stagnation region at the barrier is reduced by giving the barrier a geometry (i.e. shape in plan view) and orientation such that as the barrier moves (relative to the flow), the sides of the barrier are not perpendicular to the flow of ambient gas. The plan view is a plane in which the scanning direction SC and the stepping direction ST lie. In other words, the geometry of the barrier is streamlined with respect to a flow of ambient gas in a certain direction, e.g. the direction of the flow of ambient gas, external to the protected volume when scanning takes place.

The present invention provides a barrier system configured to provide a barrier operative to reduce an inflow of ambient gas into a protected volume between a first surface and a second surface. Radiation beams can pass through the protected volume between the surfaces. Therefore, the protected gas through which a radiation beam passes can be controlled. The radiation beam can be a projection beam or a measurement beam. The present invention will be described in detail below in different embodiments.

In an embodiment, a lithographic apparatus is provided comprising a first component and a second component. In this embodiment, the first component comprises a substrate table WT and the second component comprises a grid G. Grid G is mounted on a reference frame RF. The first component and the second component are configured to undergo relative movement with respect to one another in one of or both of the scanning direction SC and the stepping direction ST. The first component or the second component may remain stationary whilst the other component moves relative to it. The first component and second component may also move relative to each other in directions other than the scanning direction SC and the stepping direction ST.

The substrate table WT has a first surface 1 and the second component has a second surface with the grid G thereon. The first surface 1 and the second surface face each other. The first surface 1 and the second surface may face each other such that they are in parallel planes. Both the surfaces may be horizontal, as depicted in FIG. 3B. FIG. 2 depicts a schematic plan view of the substrate table WT wherein the central arrow indicates the relative movement of the substrate table WT with respect to the second component. In this embodiment, the arrow on the substrate table WT indicates that the substrate table WT and second component move relative to each other in the scanning direction SC.

In this embodiment, the first surface 1 on the substrate table WT accommodates at least one barrier system 3. On the substrate table WT of FIG. 2, four barrier systems 3 can be seen. Other components may be included on the substrate table WT which have not been shown, for example components required to hold a substrate. Each barrier system 3 is configured to provide a barrier 4 operative to reduce an inflow of ambient gas into a protected volume of gas between the first surface 1 and the second surface. Each of the barrier systems 3 shown comprises at least one opening adapted for a flow of barrier gas therefrom for establishing a gas curtain enclosing part of the protected volume adjacent the first surface 1.

In this embodiment, the barrier 4 has a geometry in a plane in which the scanning direction SC and the stepping direction ST lie. The barrier 4 is operative to guide a flow of ambient gas around the protected volume, the flow of ambient gas being induced by the relative movement of the substrate table WT and the second component. The flow of ambient gas may be the ambient gas that the object moves through. The flow of ambient gas may be induced by the movement of the object through ambient gas, even if the ambient gas is effectively stationary. The flow of ambient gas may be a relative flow, e.g. relative to the object.

Figure 3A:
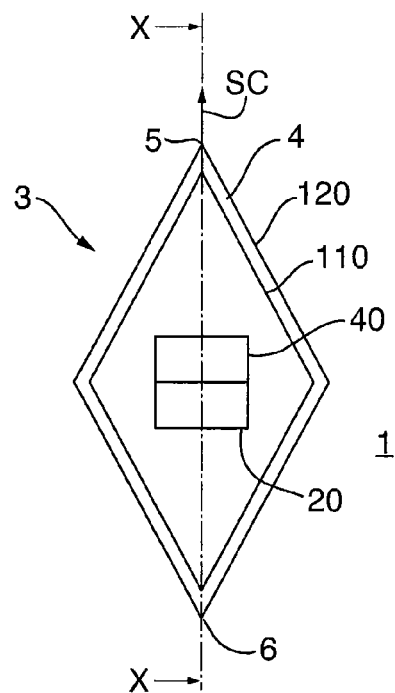
FIG. 3A depicts a plan view of a barrier system according to an embodiment of the present invention.
Figure 3B:
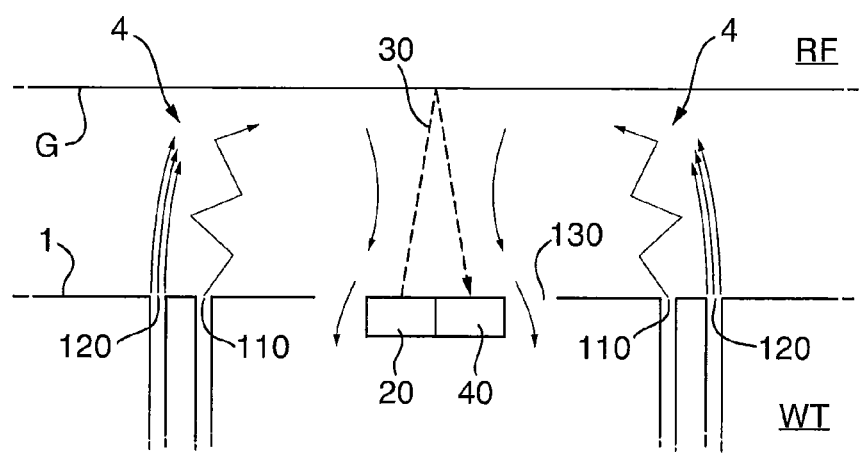
FIG. 3B depicts a side view of a barrier system according to an embodiment of the present invention.

FIG. 3A shows a barrier system 3 wherein the geometry of the barrier 4 includes a first corner 5 and a second corner 6. As can be seen, the embodiment further comprises a radiation source 20 for emitting a measurement beam 30, and a sensor 40 for detecting the measurement beam 30. The measurement beam is projected towards the grid G (shown in FIG. 3B). The sensor 40 configured to detect the measurement beam 30, is used to indicate the position and/or movement of the grid G relative to the radiation source 20 and/or the sensor 40. The sensor measures the position of the components of the lithographic apparatus relative to one another using the grid G.

In this embodiment, the second component comprises a grid G on the second surface. The grid G may be directly on the second component on the second surface. Alternatively, the second component comprises a grid plate, wherein the surface of the grid plate is the second surface. In this embodiment, the second component is a reference frame RF with a grid G on the second surface or a grid plate attached thereon.

The barriers 4 are depicted in the Figures as lines but are not solid objects. Rather a barrier 4 in this embodiment amounts to a region of flow and/or pressure which does not have precise boundaries, and the barriers 4 as depicted should be taken to have a shape generally as shown.

Figure 6A:
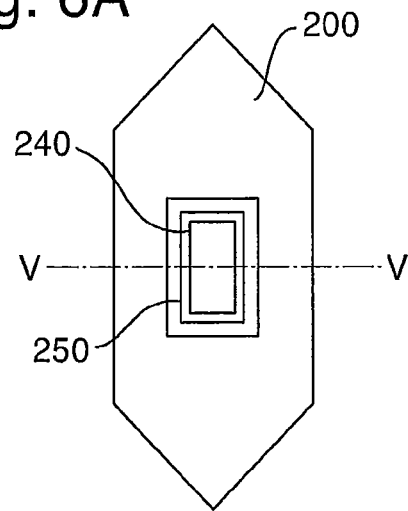
FIGS. 6A, 6B and 6C depict a barrier system according to an embodiment of the present invention wherein the barrier system comprises a wall.
Figure 8B:
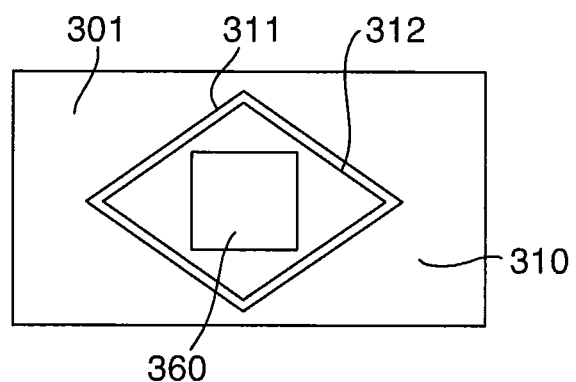
Figure 8C:
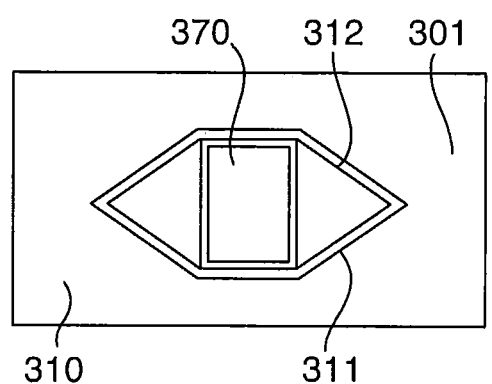

The shapes in FIGS. 3A, 6A and 8C show examples of different shapes which could be used in the present invention. The shapes depicted include a rhombus and a hexagon. However, there are clearly many variations which would fall within the scope of the claims of the present invention, for example a kite-shaped geometry, in which a first pair of sides are of the same length, and a second pair of sides are of the same length, different from the length of the first pair of sides. The shapes of the barrier shown, and other shapes not depicted, are interchangeable for the barrier systems in all of the embodiments disclosed.

An advantage of using the geometry of the present invention and optimising the shape of the barrier 4 is that this can lead to a reduction in the overall space required for the barrier 4 in plan. In known lithographic systems, multiple sensors are used and often there is overlap between different systems, for example a gas curtain around the sensor may be ejected directly onto a barrier system on an opposite surface surrounding a different sensor. This overlap can reduce the accuracy of either one or both of the sensors. The geometry used in the present invention decreases the area in plan required for the barrier 4 and as such, the barrier system 3, such that there may be less overlap between different barrier systems.

At least the first corner 5 and the second corner 6 are not necessarily a sharp point as depicted in FIGS. 2 and 3A. The corners of the geometry may be rounded, with a predetermined radius. The geometry has a long axis and a short axis as described later. Each radius is preferably less than 10% of the short axis.

The sides of the barrier geometry as depicted are straight in plan view, as in FIG. 3A. The sides of the geometry do not have to be straight, but instead at least one of the sides may have a radius of curvature. At least one of the sides may have a curved shape in plan.

At least one opening for establishing the barrier 4 (i.e. the gas curtain) is configured to surround the radiation source 20 and the sensor 40 in order to provide a flow of barrier gas that shields the protected volume, through which the measurement beam passes. In this embodiment, the barrier system 3 comprises openings adapted for the flow of barrier gas therefrom for establishing a gas curtain enclosing the protected volume adjacent to the first surface 1. A cross-section through the centre of the barrier system 3, marked X-X in FIG. 3A, is shown in FIG. 3B. As can be seen in FIG. 3B, the protected volume is defined between the surface of the substrate table WT and the grid G, in which the barrier gas is controlled by the openings on the substrate table WT.

The barrier 4 reduces the amount of ambient gas from outside the barrier 4 entering the protected volume of gas between the first surface 1 and the second surface. As such, the barrier system 3 provides a barrier 4 to protect and maintain the protected volume within the barrier 4. The protected gas inside the protected volume may be controlled or conditioned, which reduces fluctuations in the refractive index, which affects the measurement beam 30 as described above.

The protected gas is the gas within the protected volume. The protected gas may be derived from the barrier gas and/or may be provided into the protected volume by another outlet (not shown in the Figures).

The geometry of the barrier 4 is defined by the location of the barrier gas outlets, i.e. the openings on the first surface 1 as shown in FIGS. 3A and 3B. The barrier gas is provided by a source 50. Because the radiation source 20 and sensor 40 are provided on a moving object, the barrier gas flow has to maintain uniformity and stability both during movement of the substrate table WT at up to 2 m/s relative to the second component as well as at standstill. Additionally, the barrier gas flow needs to be robust against other disturbances in the ambient gas in the lithographic apparatus. A first opening 110 is provided adjacent the radiation source 20 and sensor 40. The first opening 110 is arranged to provide a first barrier gas from the source 50. The first barrier gas may be a mixture of gases e.g. artificial air, or may be a single gas, for example an inert gas such as nitrogen. The first barrier gas may be conditioned in terms of its temperature, its humidity and/or composition. On exiting the opening 110, the first barrier gas moves to the sensor beam path.

The first opening 110 is constructed to provide the first barrier gas with a first flow characteristic. The first flow characteristic may be turbulent. The first flow velocity may be approximately 10 m/s to 20 m/s. As such, the first flow may be described as a high velocity jet. The first opening 110 may be a single continuous opening or a series of openings such as discrete openings in a line. The first opening 110 is depicted as a single continuous opening in FIG. 3A. The first opening 110 is configured such that the first barrier gas exiting it surrounds the measurement beam path and/or flows into the measurement beam path.

A second opening 120 is provided. The second opening 120 is constructed and arranged to provide a second barrier gas from the source 50. The second barrier gas may be supplied from the same source as the first barrier gas. The second barrier gas may be a mixture of gases e.g. artificial air, or may be a single gas, for example an inert gas such as nitrogen. The second barrier gas may be conditioned in terms of its temperature, its humidity and/or composition.

The second barrier gas from the second opening 120 is provided adjacent the first barrier gas from the first opening 110. The second opening 120 is constructed and configured to provide the second barrier gas with a second flow characteristic. The second flow may have a velocity which is lower than the first flow velocity. The second flow may have a velocity of approximately 1 m/s. The second flow characteristic is different from the first flow characteristic. The second flow characteristic may be laminar. The flow of the second barrier gas out of the second opening 120 acts as a shield to prevent unconditioned ambient gas radially outwardly of the second opening 120 with respect to an optical axis of the sensor 40 from being entrained by the turbulent flow of the first barrier gas exiting the first opening 110. Thus the second opening 120 is configured such that the flow of the second barrier gas prevents unconditioned ambient gas reaching the sensor beam path.

The second opening 120 may be a single continuous opening or a series of openings such as discrete openings in a line. The second opening 120 is depicted as a single continuous opening in FIG. 3A.

The radiation source 20 and sensor 40 are positioned such that the radiation beam 30 passes through the protected volume within the barrier provided by the first opening 110 and the second opening 120. The radiation source 20 and the sensor 40 may be located adjacent to the protected volume, the radiation source 20 and the sensor 40 may be inset within the reference frame RF or the radiation source 20 and the sensor 40 may be within the protected volume. The radiation source 20 and the sensor 40 can be seen to be surrounded by the first opening 110 and the second opening 120 in plan view as shown in FIG. 3A. Furthermore, the second opening 120 is on the opposite side of the first opening 110, between the first opening 110 and the ambient gas. The first opening 110 is an inner opening. The second opening 120 is an outer opening.

As can be seen in FIG. 3A, both the first opening 110 and the second opening 120 surround the radiation source 20 and sensor 40. The first opening 110 and the second opening 120 are concentric.

The first opening 110 and the second opening 120 provide barrier gas flow as illustrated in FIG. 3B. The barrier gas flow is in a direction substantially parallel to a direction of the path of the measurement beam 30. That is, the flow is towards the grid G on the surface of the second component. The first barrier flow through the first opening 110 is turbulent. The turbulent flow entrains second barrier gas from the laminar flow exiting the second opening 120. This ensures good dynamic mixing properties when the substrate table WT is moving at high speed. Additionally entrapment of unconditioned ambient gas by the turbulent flow is avoided by actively supplying second barrier gas just outside the turbulent first barrier gas flow. The laminar flow of the second barrier gas acts as a seal, by blowing away or shielding any unconditioned ambient gas that is about to enter the protected volume. The unconditioned ambient gas stays outside the laminar flow and is prevented from entering the protected volume.

The geometry of the barrier 4 has a first corner 5 and a second corner 6. The first corner 5 serves as a leading edge of the barrier 4 and second corner 6 serves as a trailing edge of the barrier 4 when the substrate table WT and the second component move relative to one another in the scanning direction SC, e.g. the forward scanning direction. The first corner 5 serves as the trailing edge of the barrier 4 and the second corner 6 serves as leading edge of the barrier 4 when the substrate table WT and the second component move relative to one another in a direction opposite the scanning direction SC, e.g. the backward scanning direction. The forward scanning direction is depicted by an arrow in FIG. 2.

The leading corner is the first part of the barrier 4 that meets the flow of ambient gas. The trailing corner is the hindmost part of the barrier 4 in the direction of relative movement. This means that the flow does not meet a surface of the barrier 4 at an angle perpendicular to the surface i.e. the edge of the barrier 4 is slanted with respect to the flow. Due to this geometry, the flow can be effectively guided around the barrier 4. This is beneficial because the barrier 4 is more streamlined which reduces the stagnation region. As such, the amount of break-through is decreased (or prevented) which reduces unconditioned ambient gas entering into the protected volume. Variations in the temperature, humidity and/or composition of the gas in the protected volume, through which the measurement beam 30 passes, are reduced, and improved measurements can be taken by the measurement system. This can improve the positioning of the radiation beam on the substrate, for example, by controlling the position of the components relative to each other based on these measurements.

As depicted in FIG. 3A and in accordance with the above embodiment, the barrier 4 has a cornered geometry in plan, the cornered geometry having sides between corners which are all non-perpendicular to a specific one of the scanning direction SC and the stepping direction ST. The cornered geometry has a leading corner and a trailing corner. Providing a barrier 4 with sides, none of which are perpendicular to the scanning direction SC and the stepping direction ST helps to decrease the stagnation region as described above. As such, the present invention provides a barrier 4 which reduces an inflow of ambient gas into the protected volume within the barrier 4.

FIG. 3A shows a barrier 4 with a geometry that has an imaginary line through its centre and passing through two of the corners of the geometry. The imaginary line may pass through the centre of the geometry and at least one corner. This line is in a first direction. In this embodiment, the first direction is the same as the scanning direction SC, as can be seen in FIGS. 2 and 3A. In this embodiment, the imaginary line passes through the first corner 5 which is a leading corner and the second corner 6 which is a trailing corner.

The geometry of the barrier 4 shown in FIG. 3A has a maximum dimension in the first direction (the long axis) which is greater than the maximum dimension in a second direction (the short axis), which is orthogonal to the first direction. This means that the geometry is elongate in the first direction. Elongation of the geometry leads to a more streamlined shape which can aid the movement of ambient flow around the barrier 4 and reduce break-through.

The aspect ratio is the ratio of the maximum dimension in the first direction to the maximum dimension in the second direction. The aspect ratio may be optimised to alter the stagnation regions which build up at the side(s) of the barrier 4. The aspect ratio may be altered to streamline the shape. The optimum ratio might depend on the speed at which the components move relative to each other, the location of the barrier system 3, the surface which is used to accommodate the barrier system 3 and so on. Furthermore, the ratio and overall size of the barrier geometry is constrained by the minimum volume required within the barrier 4. For example, in the present embodiment, the barrier 4 must be large enough to accommodate the radiation source 20 and the sensor 40.

The aspect ratio may be at least 1.3:1, preferably at least 1.5:1. In the present embodiment, the aspect ratio may be as high as 2.5:1. Although it is not necessary that a high aspect ratio is used to create a streamlined geometry, a more elongate geometry (i.e. with a higher aspect ratio) is likely to be more streamlined, such that the flow is more effectively guided around the barrier 4. The aspect ratio may be chosen depending on the desired geometry and/or shape. The desired aspect ratio may depend on the location of the barrier system 3 within the lithographic apparatus as described in further embodiments.

The adjacent sides can affect how streamlined the geometry is. As depicted in FIGS. 2 and 3A, the geometry has four sides. Generally, the geometry may have (but not limited to) four to eight sides, inclusively, i.e. 4, 5, 6, 7 or 8 sides.

The lengths of the adjacent sides may be the same, as depicted in FIG. 3A. Furthermore, the geometry may be made to be symmetrical with respect to a plane, the plane being parallel to the first direction, and also parallel to a direction which is perpendicular to both the first direction and second direction. As such, the geometry of FIG. 3A forms a mirror image in plan view on either side of the imaginary line in the first direction. It is not essential for the geometry to be symmetrical. However, having a symmetrical geometry provides the advantage of minimising the pressure difference across the protected volume within the barrier 4. By minimising the pressure difference, the flow of gas through the barrier 4, across the protected volume, is reduced. This is beneficial because it reduces the amount of ambient gas entering into the protected volume.

The first opening 110 and the second opening 120 are each shown as a single continuous opening around the geometry. As mentioned, the first opening 110 may be a series of discrete openings and/or the second opening 120 may be a series of discrete openings.

In an embodiment, the openings may be used to provide a dynamic gas barrier. This embodiment is the same as the above embodiment except that the barrier geometry is a dynamic barrier geometry i.e. the barrier geometry has a variable shape. The dynamic barrier geometry may be altered, for example by altering the flow of gas provided by the barrier system 3 as will be further described. As mentioned, each of the first opening 110 and the second opening 120 may comprise a series of discrete openings. A series of discrete openings used for the first opening 110 will be referred to as the first outlets. A series of discrete openings used for the second opening 120 will be referred to as the second outlets. The first outlets and the second outlets may be controlled by the barrier system 3 to release barrier gas. Different outlets may be releasing barrier gas at different times to control the geometry of the gas barrier provided. The first outlets and the second outlets may be controlled to release barrier gas from different individual outlets selectively to create a barrier with different geometries in plan. As such, some of the first outlets and/or some of the second outlets may not be used to (i.e. may not be necessary for a particular shape/geometry) provide the first opening 110 and/or the second opening 120 respectively.

The first outlets may be used to provide a given shape for the first opening 110. The first outlets may not all be used at the same time i.e. to provide a desired shape, only a subset of the first outlets may be used to provide the first opening 110. The second outlets may be used to provide a given shape for the second opening 120. The second outlets may not all be used at the same time, i.e. to provide a desired shape, only a subset of the second outlets may be used to provide the second opening 120. The geometry provided by each of the first and second openings 110, 120 may be altered by controlling the outlets such that the barrier geometry is changeable, i.e. dynamic. The outlets used for the first opening 110 and the second opening 120 may be made to be interchangeable, i.e. the discrete outlets used for the first opening 110 may be used for the second opening 120 when the barrier geometry is altered, and vice versa.

Providing a barrier geometry with a variable shape may be beneficial because the geometry may be adapted to optimise the flow of ambient gas around the barrier 4, which as mentioned, can help reduce break-through of ambient gas into the protected volume. For example, the orientation of the barrier geometry may be altered by releasing barrier gas from different outlets, i.e. a different subset of first outlets and/or a different subset of second outlets. The geometry of the barrier 4, such as the orientation, may be optimised depending on different factors, for example, the speed of relative movement of the components.

In the above embodiment, the directions of importance are directions in which the components of the apparatus move at a relatively high velocity, e.g. the scanning direction SC and the stepping direction ST. Ambient gas within the lithography apparatus is generally turbulent without a specific main flow direction. For example, in the locality of the substrate table WT the ambient gas is made up of gas from various sources, e.g. gas showers, etc. which affect the global flow behaviour within the lithographic apparatus. The flow of ambient gas may also be affected by other features, e.g. gas extractors etc. However, during scanning, the maximum flow velocity that the deformable body will experience is generally determined by the scanning velocity in the scanning direction SC. Compared to this velocity, all the other flow velocities in other directions are usually negligible because the scanning direction SC is generally the direction in which components move relative to each other at a higher speed than in other directions. Therefore, the problem tends to be more prominent when the components are moving relative to each other in the scanning direction SC rather than the stepping direction ST because the components tend to move faster in this direction.

It is beneficial to optimise the geometry of the barrier with respect to the direction of ambient gas flow which results from the relative movement of the components. The relative flow direction is the direction of flow of the ambient gas outside the protected volume induced by the relative movement of the first component and the second component. This may not be in the same direction as the scanning direction SC.

Different embodiments may have different optimum orientations of the geometry. The orientation of the geometry may be defined by reference to a tilt angle, being the angle between the imaginary line (the line through the centre and at least one corner) and the scanning direction SC i.e. the first direction (of the imaginary line through the geometry) is tilted with respect to the scanning direction SC. The tilt angle α is shown for the barrier system 100 in FIG. 4. The barrier system 100 may be the same as the barrier system described in previous embodiments, such as the barrier system 3 depicted in FIGS. 2 and 3A, and is interchangeable with the barrier system 3 throughout the application. The tilt angle α may be optimised to improve streamlining in the direction of ambient gas flow which results from the relative movement of the components. The leading edge 105 and the trailing edge 106 are not in line with the scanning direction SC in FIG. 4.

Figure 4:
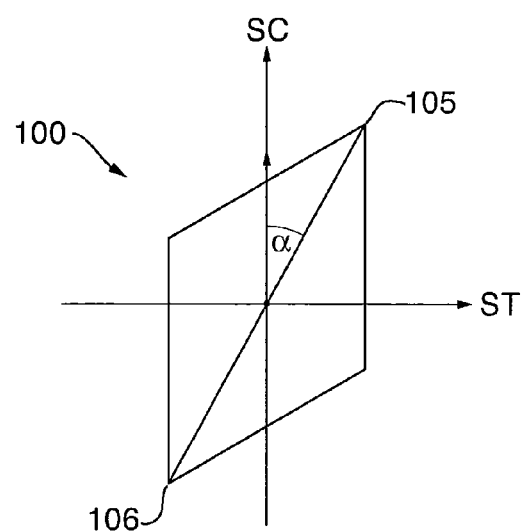
FIG. 4 depicts a barrier system according to an embodiment of the present invention in which the barrier system is tilted with respect to the scanning direction.

The optimum tilt angle α may vary depending on the location of the barrier within the lithographic apparatus. The optimum tilt angle α may depend on various factors affecting movement of the ambient gas around the barrier, for example, the speed of the first component, the speed of the second component, the location of the barrier system 100 and/or the direction of the ambient gas flow due to relative movement of the components. The desired tilt angle α may also vary depending on what other components are surrounding or near the barrier system 100, i.e. what other components are nearby that may affect the relative flow of the ambient gas surrounding the barrier system 100. There may be no tilt between the first direction and the scanning direction SC as shown in FIGS. 2 and 3A. However, in another embodiment, the tilt angle is optimised depending on the relative flow. For example, in some embodiments, the tilt angle α, as indicated in FIG. 4, between the first direction and the scanning direction SC is preferably more than 0° and/or less than 90°. More preferably, the tilt angle α is greater than 5°. The tilt angle α may be between 0° and 60°, preferably between 30° and 60°, or more preferably between 40° and 50°.

In any of the embodiments, the grid G may be replaced with a marker and/or target for detection by the sensor 40.

Further embodiments are described below. In the embodiments below, the features of the lithographic apparatus are similar in structure and function to the previous embodiments described, and therefore, provide the same advantages. Only differences between the embodiments will be discussed in the following embodiments.

Figure 5:
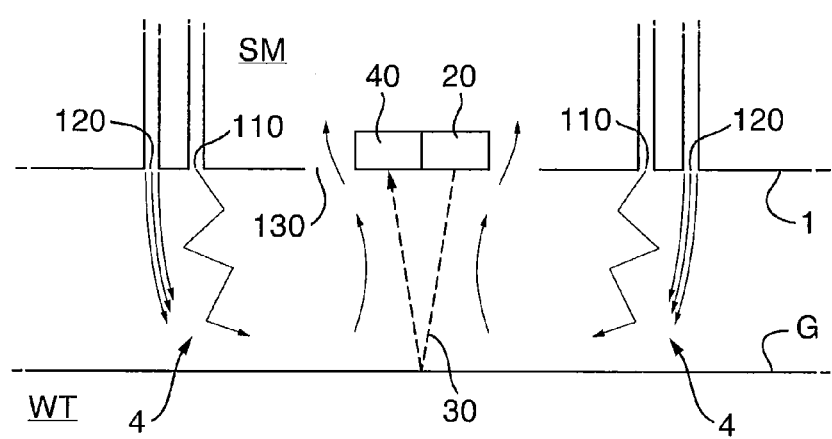
FIG. 5 depicts a barrier system according to an embodiment of the present invention.

In an embodiment, the first component is a sensor module SM and the second component is a substrate table WT with a grid G. The sensor module SM has the first surface 1 and the substrate table WT has the second surface. The sensor module SM accommodates a barrier system 3 as previously described. The grid G may be marked directly on the substrate table WT itself, or alternatively, the substrate table WT comprises a grid plate, such that the surface of the second component is the grid G on the grid plate. In this embodiment, the radiation source 20 and the sensor 40 are on the first component i.e. the sensor module SM, rather than the substrate table WT as in the previous embodiment. Effectively, this embodiment is largely the same as the previous embodiment except that the first component and the second component have been interchanged. An example of this embodiment is depicted in FIG. 5. In this embodiment, the sensor module SM may be mounted to, or a part of, a reference frame RF. In this embodiment, the grid G may be replaced with a marker and/or target for detection by the sensor 40.

In an embodiment, the invention as described above is applied to a measurement system comprising an optical system and a target and/or marker. A barrier system 3 as described above is provided on a surface, and the barrier 4 surrounds a marker and/or target (rather than surrounding the radiation source 20 and/or sensor 40 as described above), i.e. the barrier system 3 is on a surface opposite the radiation source 20 and/or sensor 40.

In an embodiment, the invention as described above is applied to an alignment sensor which is configured to detect a marker on the substrate W. A barrier system 3 as described above is provided on a surface, and the barrier system 3 is on the same surface as the alignment sensor, opposite the substrate W. The barrier system 3 may surround multiple alignment sensors, each of which detects a radiation beam which passes through the protected volume surrounded by a single barrier. Furthermore, multiple sensors of different types may be surrounded by one barrier. Furthermore, multiple sensors of the same type may be surrounded by one barrier. Each alignment sensor may measure a different marker on the substrate and/or multiple alignment sensors may be used to detect the same marker. Additionally, or alternatively, multiple barrier systems 3 may be provided, each of which is used in relation to one alignment sensor.

In an embodiment, the barrier system of the present invention may be applied to an alignment sensor which may be attached to, or forming a part of, a reference frame RF. An example of the alignment sensor is described in US 2008/0043212 A1, which is incorporated by reference in its entirety.

In an embodiment, the barrier system 3 may comprise a wall enclosing part of the protected volume adjacent the specific one of the first surface and second surface. In this embodiment, the wall surrounds a defined volume. The wall is a protrusion from the first or second surface. The wall has a geometry which is the same as any one of the geometries described above for the gas curtain.

When a gas curtain is used, break-through can be a problem. When using the wall, break-through does not occur but ambient gas can flow over the top of, or underneath the wall into the protected volume. Therefore, in the present embodiment, the barrier is provided with the same geometry as described above to reduce the flow of ambient gas into the protected volume. The shape of the barrier geometry guides flow around the barrier when there is relative movement. As such, this reduces (or prevents) the amount of ambient gas which enters the protected volume. As a result, a radiation beam passing through the protected volume is less affected than if placed within a barrier using an alternative geometry not in accordance with the present invention.

Figure 6B:
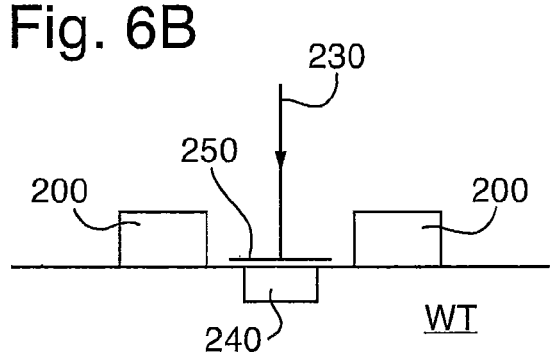

This embodiment is depicted in FIGS. 6A and 6B. In this embodiment, the first component is a substrate table WT with a sensor 240 on the first surface and a barrier system provides a barrier 200 around the sensor 240. The sensor 240 may be a transmission image sensor, or an energy sensor (also known as a spot sensor) used to measure the projection beam 230. When the sensor 240 is in use, the projection beam 230 passes through the protected volume protected by the barrier 200. The projection beam 230 passes through a transmissive marker plate 250 to the sensor 240. In this embodiment, the barrier 200 is a wall. A geometry is shown in FIG. 6A which may be used for this embodiment. This geometry is interchangeable with the geometries provided for any other barrier as described. An example of a barrier system in accordance with this embodiment can be seen in FIG. 6B, which shows a transmission image sensor in side view through cross-section V-V of FIG. 6A.

Figure 6C:
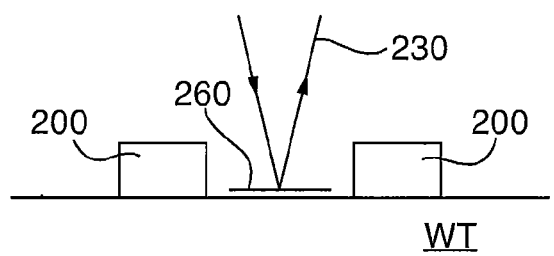

A variant of the above embodiment is seen in FIG. 6C, in which a reflective marker plate 260 is provided on the first surface instead of a transmissive marker plate 250. The projection beam 230 reflects from the marker plate 260 and is detected by a sensor (not shown). In this example, the sensor may not be on either of the first surface or the second surface.

In an embodiment, the barrier system of the present invention is applied to a level sensor 285, the level sensor 285 being used to measure the topography of a surface, in this case, the substrate W. An example of this embodiment is depicted in FIG. 7. In this embodiment, the first component is the substrate W and the second component accommodates the barrier system and a level sensor 285, and the barrier system provides a barrier 290, which may be a wall. The second component may be a sensor module attached to, or forming a part of, a reference frame RF. In this embodiment, the radiation beam is a measurement beam 270 and is emitted from a radiation source 280 not on either of the first component or the second component. Generally, the measurement beam 270 used for the level sensor 285 is reflected off the substrate W before reaching the level sensor 285 with an angle of incidence far from perpendicular. In this embodiment, the measurement beam 270 passes through the protected volume adjacent to the level sensor 285. The level sensor 285 may be used when scanning of the substrate W is taking place or when measurements are being taken. The barrier system of the present invention may be utilised around at least a part of the projection beam to protect the projection beam as it passes between different components. For example, the barrier system may be used to protect the patterned projection beam to reduce fluctuations in the refractive index of the protected gas, which can affect the path of the projection beam between the patterning device MA and the substrate W.

In an embodiment, the projection beam passes through the barrier system. In this embodiment, the first component is a plate referred to as a lens top environment (LTE) plate 310, between the support structure MT and the top of the projection system PS, having the first surface 301. FIG. 8A depicts the barrier system 300 of the present embodiment. The top lens 320 of the projection system PS is below the LTE plate 310. The second component is the support structure MT. The bottom surface of the support structure MT is generally the second surface 302. The projection beam passes through an opening 360 in the LTE plate 310. The LTE plate 310 may include an opening 360 having sidewalls 360*a* and 360*b* that are substantially parallel to each other and substantially perpendicular to a scanning direction SC of the support structure MT). The first surface 301 of the LTE plate 310 accommodates the barrier system 300.

In FIG. 8A, the barrier system 300 comprises openings 311 and 312 (more or less openings may be provided) for establishing a barrier (i.e. a gas curtain) enclosing part of the protected volume adjacent to the first surface 301. The barrier system as described in any of the previous embodiments may be used to protect the protected volume of protected gas between the LTE plate 310 and the support structure MT. The barrier system 300 may comprise a barrier which may be provided with any of the above described geometries. As depicted in FIG. 8A, this embodiment may not include a radiation source, sensor, grid G or marker and/or target. The projection beam passes through the protected volume to the projection system PS and is less likely to be affected by gas outside the protected volume. As such the present embodiment provides the advantages of the present invention as described above. FIG. 8B shows an example geometry of this embodiment including the LTE plate 310, in plan view. FIG. 8B shows how a similar barrier geometry to the above embodiments may be provided on the LTE plate 310. In this example, the barrier system provides a barrier using openings 311 and 312 to emit gas to protect the volume within the barrier. The openings 311 and 312 may be continuous or discrete, as described above. The projection beam passes through the protected volume, through the opening 360 to the projection system PS. The barrier geometry of FIG. 8B is interchangeable with the barrier geometry of other embodiments, for example, as depicted in FIGS. 4, 6A and 8C.

A manipulator plate 370 may optionally be provided in the opening 360 of the LTE plate 310. This is not shown in FIG. 8B. WO 2013/174646 A1 discloses a lithographic apparatus comprising a manipulator plate 370. The manipulator plate 370 is located between the patterning device MA and the substrate WT to control the focus of the radiation beam. The apparatus relating to the manipulator plate 370 as described in WO 2013/174646 A1 is herein incorporated by reference in its entirety.

FIG. 8C depicts an example of a geometry for this embodiment, including the manipulator plate 370. The manipulator plate 370 may be adapted to tilt about the X and Y directions wherein the X direction is the scanning direction SC and the Y direction is the stepping direction ST. The manipulator plate 370 may be used to adjust the placement of the projection beam on the substrate W by affecting the placement of the projection beam on entry into the projection system PS. The manipulator plate 370 may be tilted using actuators (not shown). Tilting the manipulator plate 370 shifts the projection beam such that the image projected onto the substrate W is shifted. By tilting the manipulator plate 370 about an axis in the Y direction an image shift in the X direction will be created, while tilting the manipulator plate 370 about an axis in the X direction will cause an image shift in the Y direction. Tilting the manipulator plate 370 in both directions would provide a shift in both the X and Y directions.

The manipulator plate 370 may be made of any material that is transparent to the radiation in question, e.g. a suitable material would be glass. The manipulator plate 370 may be made of a flexible material such that in addition to or instead of a tilting movement the manipulator plate 370 may be bent which can cause a shift in the focus. Bending of the manipulator plate 370 may be created by one or more actuators (not shown) provided along one or more of the edges of the manipulator plate 370.

In each embodiment many parameters may be optimised to improve the stability of the protected volume within the barrier. These parameters include, but are not limited to, the tilt angle $\alpha$ between the imaginary line (through the centre and at least one corner of the geometry) and the specific direction (or a direction of flow of ambient gas resulting from the relative movement of the components), the ratio of the maximum dimension of the geometry in the first direction to the maximum dimension of the geometry in the second direction, the length of the adjacent sides and the symmetry of the geometry.

Each of the first component and the second component could be multiple different components of the lithographic apparatus. The features of the above embodiments may remain the same except for the variation in the first component and second component. For example, the first component could be one of: the substrate W, the substrate table WT, a reference frame RF, the projection system PS, the support structure MT, the patterning device MA, a component of the illumination system IL, or another component of the lithographic apparatus. For example, the second component could be a different one of: the substrate W, the substrate table WT, a reference frame RF, the projection system PS, the support structure MT, the patterning device MA, a component of the illumination system IL, or another component of the lithographic apparatus.

Furthermore, the barrier system may be accommodated on the same surface as at least one of a sensor, radiation source and marker and/or target. Alternatively, or additionally, the barrier system may be accommodated on the surface opposite at least one of a sensor, radiation source and marker and/or target.

In any of the above embodiments, the openings used to establish the gas curtain are interchangeable with the wall, and vice versa. The wall may be provided in addition to, or instead of the openings used to establish the gas curtain.

Various barrier systems may be provided within the lithographic apparatus. As such, the barrier system may be utilised in different locations throughout the lithographic apparatus. Multiple barrier systems may be provided using the same or different embodiments.

A lithographic apparatus in accordance with at least one of the above embodiments may be used in a device manufacturing method to irradiate a substrate using a projection beam.

In an embodiment, there is provided a lithographic apparatus comprising a first component and a second component that are configured to undergo relative movement with respect to one another in a scanning direction and/or a stepping direction substantially perpendicular to the scanning direction, wherein: the first component has a first surface; the second component has a second surface; wherein the first surface and the second surface face each other; at least a specific one of the first surface and the second surface accommodates a barrier system; and the barrier system is configured to provide a barrier operative to reduce or prevent an inflow of ambient gas into a protected volume of gas between the first surface and the second surface; and the barrier system comprises at least one selected from: a wall enclosing part of the protected volume adjacent the specific one of the first surface and second surface; and/or at least one opening adapted for a flow of barrier gas therefrom for establishing a gas curtain enclosing part of the protected volume adjacent the specific one of the first surface and second surface; the barrier has a geometry in a plane in which the scanning direction and the stepping direction lie, and the barrier is operative to guide a flow of ambient gas around the protected volume, the flow of ambient gas being induced by the relative movement of the first component and the second component; the geometry has a first corner and a second corner; the first corner serves as a leading edge of the barrier and the second corner serves as a trailing edge of the barrier when the first component and the second component move relative to one another in a specific one of the scanning direction and the stepping direction; and the first corner serves as the trailing edge of the barrier and the second corner serves as the leading edge of the barrier when the first component and the second component move relative to one another in a further direction opposite to the specific direction.

In an embodiment, at the specific one of the first surface and the second surface, an imaginary line in a first direction is defined, the imaginary line passing through the first corner and the second corner. In an embodiment, the geometry is symmetrical about the first direction, and/or wherein the geometry is elongate in the first direction, and/or wherein the first direction is tilted with respect to the specific direction. In an embodiment, the barrier system comprises the at least one opening adapted for a flow of barrier gas therefrom for establishing a gas curtain enclosing part of the protected volume adjacent the specific one of the first surface and second surface and wherein an opening of the at least one opening is an inner opening providing a turbulent flow of barrier gas, and/or wherein an opening of the at least one opening is an outer opening providing a laminar flow of barrier gas. In an embodiment, a radiation beam passes through the protected volume. In an embodiment, the radiation beam is a radiation beam directed to a sensor. In an embodiment, the first and/or second component has/have at least one target thereon for detection by the sensor. In an embodiment, the sensor is an alignment sensor configured to measure alignment of one object relative to another. In an embodiment, one of the first component and the second component comprises a substrate table, and the other of first component and the second component comprises a reference frame. In an embodiment, the protected volume is in contact with the sensor. In an embodiment, the sensor is a level sensor configured to measure the topography of a surface. In an embodiment, the lithographic apparatus comprises a plate on top of a projection system configured to project a projection beam onto a substrate, and one of the first component and the second component comprises the plate. In an embodiment, the lithographic apparatus comprises a patterning device table, and the other of the first component and the second component comprises the patterning device table.

In an embodiment, there is provided a device manufacturing method comprising projecting a projection beam onto a substrate positioned on a substrate table in an apparatus and/or using a beam of radiation to measure a property of the apparatus, wherein the projection beam and/or the beam of radiation passes through a barrier system configured to provide a barrier, the barrier being operative to reduce or prevent an inflow of ambient gas into a protected volume of gas between a first surface and a second surface of the apparatus for passage therethrough of the projection beam and/or the radiation beam, the apparatus comprising a first component having a first surface and further comprising a second component having a second surface, the first component and the second component being configured to undergo relative movement with respect to one another in a scanning direction and/or a stepping direction substantially perpendicular to the scanning direction, wherein the barrier has a geometry in a plane in which the scanning direction and the stepping direction lie, and the barrier is operative to guide a flow of the ambient gas around the protected volume, the flow of the ambient gas being induced by the relative movement of the first component and the second component; the geometry has a first corner and a second corner; the first corner serves as a leading edge of the barrier and the second corner serves as a trailing edge of the barrier when the first component and the second component move relative to one another in a specific one of the scanning direction and the stepping direction; and the first corner serves as the trailing edge of the barrier and the second corner serves as the leading edge of the barrier when the first component and the second component move relative to one another in a further direction opposite to the specific direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising a first component and a second component that are configured to undergo relative movement with respect to one another in a scanning direction and/or a stepping direction substantially perpendicular to the scanning direction, wherein:
   the first component has a first surface;
   the second component has a second surface;
   wherein the first surface and the second surface face each other;
   at least the first surface and/or the second surface accommodates a barrier system; and
   the barrier system is configured to provide a barrier operative to reduce or prevent an inflow of ambient gas into a protected volume of gas between the first surface and the second surface; and
   the barrier system comprises at least one selected from:
      a wall forming the barrier, the wall enclosing part of the protected volume adjacent the first surface and/or second surface; and/or
      at least one opening adapted for a flow of barrier gas therefrom for establishing a gas curtain as the barrier, the gas curtain enclosing part of the protected volume adjacent the first surface and/or second surface;
   the barrier has a geometry in a plane in which the scanning direction and the stepping direction lie, and the barrier is operative to guide a flow of ambient gas around the protected volume, the flow of ambient gas being induced by the relative movement of the first component and the second component;

the geometry has a first corner and a second corner;

the first corner serves as a leading edge of the barrier and the second corner serves as a trailing edge of the barrier when the first component and the second component move relative to one another in a specific direction being the scanning direction or the stepping direction; and the first corner serves as the trailing edge of the barrier and the second corner serves as the leading edge of the barrier when the first component and the second component move relative to one another in a further direction opposite to the specific direction, wherein (i) the first component or the second component comprises a movable table, and the other of first component or the second component comprises a reference frame, or (ii) the first component or the second component comprises a structure at a top end of a projection system configured to project a projection beam onto a substrate.

2. The lithographic apparatus of claim 1, wherein at the first surface and/or the second surface, an imaginary line in a first direction is defined, the imaginary line passing through the first corner and the second corner.

3. The lithographic apparatus of claim 2, wherein the geometry is symmetrical about the first direction.

4. The lithographic apparatus of claim 1, wherein the barrier system comprises the at least one opening adapted for a flow of barrier gas therefrom for establishing a gas curtain enclosing part of the protected volume adjacent the first surface and/or second surface and wherein an opening of the at least one opening is an inner opening providing a turbulent flow of barrier gas, and/or wherein an opening of the at least one opening is an outer opening providing a laminar flow of barrier gas.

5. The lithographic apparatus of claim 1, wherein a radiation beam passes through the protected volume and the radiation beam is a radiation beam directed to a sensor.

6. The lithographic apparatus of claim 5, wherein the first and/or second component has/have at least one target thereon for detection by the sensor.

7. The lithographic apparatus of claim 5, wherein the sensor is an alignment sensor configured to measure alignment of one object relative to another.

8. The lithographic apparatus of claim 5, wherein the first component or the second component comprises the movable table, and the other of first component or the second component comprises a reference frame.

9. The lithographic apparatus of claim 7, wherein the protected volume is in contact with the sensor.

10. The lithographic apparatus of claim 5, wherein the sensor is a level sensor configured to measure the topography of a surface.

11. The lithographic apparatus of claim 1, comprising the structure at a top end of a projection system configured to project a projection beam onto a substrate, and the first component or the second component comprises the structure.

12. The lithographic apparatus of claim 11, comprising a patterning device table, and the other of the first component or second component comprises the patterning device table.

13. A device manufacturing method comprising projecting a projection beam onto a substrate positioned on a substrate table in an apparatus and/or using a beam of radiation to measure a property of the apparatus, wherein the projection beam and/or the beam of radiation passes through a protected volume of gas protected by a barrier system configured to provide a barrier, the barrier being operative to reduce or prevent an inflow of ambient gas into the protected volume of gas between a first surface and a second surface of the apparatus, the apparatus comprising a first component having the first surface and further comprising a second component having the second surface, the first component and the second component being configured to undergo relative movement with respect to one another in a scanning direction and/or a stepping direction substantially perpendicular to the scanning direction, wherein at least the first surface and/or the second surface accommodates the barrier system;

wherein the barrier is in the form of a wall enclosing part of the protected volume adjacent the first surface and/or second surface and/or the barrier is in the form of a flow of barrier gas establishing a gas curtain enclosing part of the protected volume adjacent the first surface and/or second surface;

wherein the barrier has a geometry in a plane in which the scanning direction and the stepping direction lie, and the barrier is operative to guide a flow of the ambient gas around the protected volume, the flow of the ambient gas being induced by the relative movement of the first component and the second component;

the geometry has a first corner and a second corner;

the first corner serves as a leading edge of the barrier and the second corner serves as a trailing edge of the barrier when the first component and the second component move relative to one another in a specific direction being the scanning direction or the stepping direction; and the first corner serves as the trailing edge of the barrier and the second corner serves as the leading edge of the barrier when the first component and the second component move relative to one another in a further direction opposite to the specific direction, wherein (i) the first component or the second component comprises a movable table, and the other of first component or the second component comprises a reference frame, or (ii) the first component or the second component comprises a structure at a top end of a projection system configured to project a projection beam onto a substrate.

14. The method of claim 13, wherein at the first surface and/or second surface, an imaginary line in a first direction is defined, the imaginary line passing through the first corner and the second corner.

15. The method of claim 13, wherein the radiation beam passes through the protected volume and the radiation beam is a radiation beam directed to a sensor.

16. The method of claim 15, wherein the first and/or second component has/have at least one target thereon for detection by the sensor.

17. The method of claim 15, wherein the first component or the second component comprises the movable table, and the other of first component or the second component comprises a reference frame.

18. The method of claim 13, wherein the apparatus comprises the structure at a top end of a projection system configured to project a projection beam onto a substrate, and the first component or the second component comprises the structure.

19. The method of claim 14, wherein the geometry is elongate in the first direction and/or wherein the first direction is tilted with respect to the specific direction.

20. The lithographic apparatus of claim 2, wherein the geometry is elongate in the first direction and/or wherein the first direction is tilted with respect to the specific direction.

21. A lithographic apparatus comprising a first component and a second component that are configured to undergo relative movement with respect to one another in a scanning direction and/or a stepping direction substantially perpendicular to the scanning direction, wherein:
- the first component has a first surface;
- the second component has a second surface;
- wherein the first surface and the second surface face each other;
- at least the first surface and/or the second surface accommodates a barrier system; and
- the barrier system is configured to provide a barrier operative to reduce or prevent an inflow of ambient gas into a protected volume of gas between the first surface and the second surface; and
- the barrier system comprises at least one selected from:
  - a wall forming the barrier, the wall enclosing part of the protected volume adjacent the first surface and/or second surface; and/or
  - at least one opening adapted for a flow of barrier gas therefrom for establishing a gas curtain as the barrier, the gas curtain enclosing part of the protected volume adjacent the first surface and/or second surface;
- the barrier has a geometry in a plane in which the scanning direction and the stepping direction lie, and the barrier is operative to guide a flow of ambient gas around the protected volume, the flow of ambient gas being induced by the relative movement of the first component and the second component;
- the geometry has a first corner and a second corner;
- the first corner serves as a leading edge of the barrier and the second corner serves as a trailing edge of the barrier when the first component and the second component move relative to one another in a specific direction being the scanning direction or the stepping direction; and
- the first corner serves as the trailing edge of the barrier and the second corner serves as the leading edge of the barrier when the first component and the second component move relative to one another in a further direction opposite to the specific direction,
- wherein gas is all along a straight line direction between the first and second corners.

* * * * *